US008883630B2

(12) United States Patent
Jang

(10) Patent No.: US 8,883,630 B2
(45) Date of Patent: Nov. 11, 2014

(54) METHOD OF FORMING CONTACT HOLES

(71) Applicant: Samsung Display Co., Ltd., Yongin-si (KR)

(72) Inventor: Yong Jae Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/802,392

(22) Filed: Mar. 13, 2013

(65) Prior Publication Data
US 2014/0148004 A1 May 29, 2014

(30) Foreign Application Priority Data
Nov. 28, 2012 (KR) .................. 10-2012-0136262

(51) Int. Cl.
H01L 23/48 (2006.01)
H01L 21/48 (2006.01)
(52) U.S. Cl.
CPC .................................. H01L 21/486 (2013.01)
USPC ..... 438/620; 438/637; 438/700; 257/E21.575
(58) Field of Classification Search
USPC .................. 438/620, 637, 672, 675, 700; 257/E21.575, E21.577
See application file for complete search history.

(56) References Cited

U.S. PATENT DOCUMENTS

2007/0218685 A1* 9/2007 Sivakumar et al. ........... 438/675

FOREIGN PATENT DOCUMENTS

| KR | 2003-0000626 | 1/2003 |
| KR | 2003-0057183 | 7/2003 |
| KR | 2003-0057862 | 7/2003 |
| KR | 2005-0095923 | 10/2005 |

* cited by examiner

Primary Examiner — Thanhha Pham
(74) Attorney, Agent, or Firm — Christie, Parker & Hale, LLP

(57) ABSTRACT

A method of forming contact holes includes: forming a first conductive layer and a second conductive layer; forming an insulating layer on the first conductive layer and the second conductive layer; forming a photoresist pattern which exposes first and second etch surfaces of a top surface of the insulating layer; performing a first etching process on the insulating layer at a first etching rate; and performing a second etching process on the insulating layer at a second etching rate which is higher than the first etching rate, after a top surface of the first conductive layer is exposed through the insulating layer. The first etch surface is on the first conductive layer, the second etch surface is on the second conductive layer, and a distance between the second etch surface and the second conductive layer is greater than a distance between the first etch surface and the first conductive layer.

20 Claims, 6 Drawing Sheets

METHOD OF FORMING CONTACT HOLES

CROSS-REFERENCE TO RELATED APPLICATION

This application claims priority to and the benefit of Korean Patent Application No. 10-2012-0136262 filed on Nov. 28, 2012 in the Korean Intellectual Property Office, the disclosure of which is incorporated herein by reference in its entirety.

BACKGROUND

1. Field

Embodiments of the present invention relate to a method of forming contact holes, and more particularly, to a method of concurrently (or simultaneously) forming contact holes of different depths.

2. Description of Related Art

To increase the degree of integration of wiring in a semiconductor device or a substrate, the semiconductor device or the substrate may include multiple wiring layers. The semiconductor device or the substrate may include a contact hole to couple (or connect) the different wiring layers. The contact hole may include a hole formed in an insulating layer disposed between an upper wiring layer and a lower wiring layer and a conductor disposed within the hole. Thus, the contact hole may electrically couple (or electrically connect) the upper wiring layer and the lower wiring layer.

Holes may be formed in the insulating layer by an etching process. When two or more holes of different depths are formed in the insulating layer, a top surface of the lower wiring layer may be exposed through a relatively shallow hole of the insulating layer. Then, as the etching process continues, polymer created by the reaction of the exposed lower wiring layer with an etching gas may accumulate on sidewalls of the insulating layer inside the hole and sidewalls of photoresist provided on the insulating layer to pattern the hole. The polymer accumulated on the sidewalls of the insulating layer and the photoresist may hinder the etching of the insulating layer in the etching process. Therefore, after the completion of the etching process, residues of the insulating layer may remain on the lower wiring layer whose top surface is exposed through the relatively shallow hole of the insulating layer. The residues of the insulating layer existing on the lower wiring layer may increase the resistance of a contact hole by impeding the upper wiring layer and the lower wiring layer from being coupled (or connected) to each other by the contact hole. In addition, the residues of the insulating layer existing on the lower wiring layer may suppress the adhesion of the upper wiring layer to the lower wiring layer. Therefore, cracks may be created between the upper wiring layer and the lower wiring layer in the contact hole by external impact.

SUMMARY

Aspects of the present invention provide a method of forming contact holes, the method being employed to reduce residues of an insulating layer disposed on a lower wiring layer when forming two or more contact holes of different depths.

Aspects of the present invention also provide a method of forming contact holes, the method being employed to reduce the resistance of a contact hole.

Aspects of the present invention also provide a method of forming contact holes, the method being employed to reduce (or prevent) the formation of cracks in wiring layers within a contact hole.

However, aspects of the present invention are not restricted to the ones set forth herein. The above and other aspects of the present invention will become more apparent to one of ordinary skill in the art to which the present invention pertains by referencing the detailed description of embodiments of the present invention given below.

According to an aspect of the present invention, there is provided a method of forming contact holes, the method including: forming a first conductive layer and a second conductive layer on a lower structure including a substrate; forming an insulating layer on the first conductive layer and the second conductive layer; forming a photoresist pattern which exposes first and second etch surfaces of a top surface of the insulating layer; performing a first etching process on the insulating layer at a first etching rate; and performing a second etching process on the insulating layer at a second etching rate which is higher than the first etching rate, after a top surface of the first conductive layer is exposed through the insulating layer. The first etch surface is on the first conductive layer, the second etch surface is on the second conductive layer, and a distance between the second etch surface and the second conductive layer is greater than a distance between the first etch surface and the first conductive layer.

The method may further include terminating the second etching process after a top surface of the second conductive layer is exposed through the insulating layer.

The method may further include removing the photoresist pattern after the terminating of the second etching process.

The method may further include forming a third conductive layer, which is coupled to the first conductive layer, and a fourth conductive layer, which is coupled to the second conductive layer, on the insulating layer after the removing of the photoresist pattern.

The first etching process and the second etching process may be performed in an etching chamber, and a concentration of an etching gas in the etching chamber may be higher in the second etching process than in the first etching process.

The first etching process and the second etching process may be performed in an etching chamber, and bias power applied to the etching chamber may be higher in the second etching process than in the first etching process.

The first conductive layer and the second conductive layer may be coupled to each other.

The first etch surface may be at substantially the same height as the second etch surface.

The first conductive layer may be at substantially the same height as the second conductive layer.

The second conductive layer may be formed at a higher position than the first conductive layer.

According to another aspect of the present invention, there is provided a method of forming contact holes, the method including: forming a first conductive layer and a second conductive layer on a lower structure including a substrate; forming an insulating layer, whose top surface includes a first etch surface and a second etch surface, on the first conductive layer and the second conductive layer; forming a photoresist pattern which exposes the first and second etch surfaces; performing a first etching process on the insulating layer at a first etching rate; cleaning the first conductive layer under the first etch surface after a top surface of the first conductive layer under the first etch surface is exposed through the insulating layer; and performing a second etching process on the insulating layer at a second etching rate which is higher than the first etching rate after the cleaning of the first conductive layer. A distance between the second etch surface and the second conductive layer is greater than a distance between the first etch surface and the first conductive layer.

The method may further include terminating the second etching process after a top surface of the second conductive layer is exposed through the insulating layer.

The method may further include removing the photoresist pattern after the terminating of the second etching process.

The method may further include forming a third conductive layer, which is coupled to the first conductive layer, and a fourth conductive layer, which is coupled to the second conductive layer, on the insulating layer after the removing of the photoresist pattern.

The first etching process and the second etching process may be performed in an etching chamber, and a concentration of an etching gas in the etching chamber may be higher in the second etching process than in the first etching process.

The first etching process and the second etching process may be performed in an etching chamber, and bias power applied to the etching chamber may be higher in the second etching process than in the first etching process.

The first conductive layer and the second conductive layer may be coupled to each other.

The first etch surface may be at substantially the same height as the second etch surface.

The first conductive layer may be at substantially the same height as the second conductive layer.

The second conductive layer may be formed at a higher position than the first conductive layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

Figure 1:
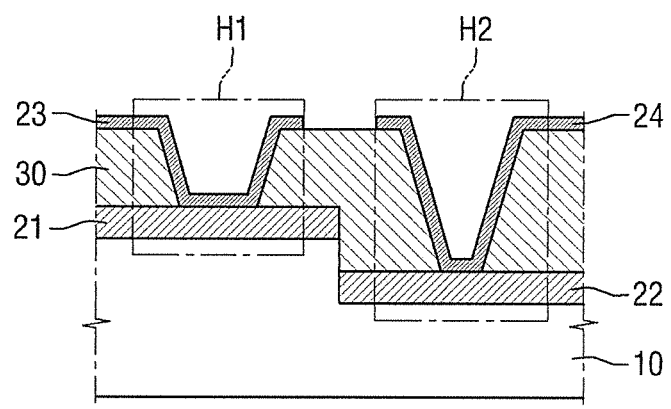
FIG. 1 is a cross-sectional view of a structure including first and second contact holes according to an embodiment of the present invention.

Aspects and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be more thorough and complete and will more fully convey the concept of the invention to those skilled in the art, and the present invention will only be defined by the appended claims and their equivalents. Thus, in some embodiments, well-known structures and devices may not be shown in order not to obscure the description of the invention with unnecessary detail. Like numbers refer to like elements throughout. In the drawings, the thickness of layers and regions may be exaggerated for clarity.

It will be understood that when an element or layer is referred to as being "on," "coupled to," or "connected to" another element or layer, it can be directly on, coupled to, or connected to the other element or layer or intervening elements or layers may be present. In contrast, when an element is referred to as being "directly on," "directly coupled to," or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments of the present invention will now be described with reference to the attached drawings.

FIG. 1 is a cross-sectional view of a structure including first and second contact holes H1 and H2 according to an embodiment of the present invention.

Referring to FIG. 1, the structure includes a lower structure 10, a first conductive layer 21, a second conductive layer 22, a third conductive layer 23, a fourth conductive layer 24, and an insulating layer 30.

The lower structure 10 may include a substrate and include all wiring layers and devices disposed under the first conductive layer 21 and the second conductive layer 22. A region of the lower structure 10 under the first contact hole H1 may protrude further upward than a region of the lower structure 10 under the second contact hole H2.

The first conductive layer 21 and the second conductive layer 22 may be formed on the lower structure 10. The first conductive layer 21 and the second conductive layer 22 may be formed at different heights. For example, the first conductive layer 21 may be formed higher than the second conductive layer 22. Even if not all regions of the first conductive layer 21 are formed higher than the second conductive layer 22, at least a region of the first conductive layer 21 which contacts the third conductive layer 23 in the first contact hole H1 may be at a higher height than a region of the second conductive layer 22 which contacts the fourth conductive layer 24 in the second contact hole H2. Therefore, if a top surface of the insulating layer 30 is flat, the second contact hole H2 may be deeper than the first contact hole H1.

The first conductive layer 21 and the second conductive layer 22 may be made of a conductive material. For example, the first conductive layer 21 and the second conductive layer 22 may be made of metal such as copper, iron, silver, gold or platinum, indium tin oxide (ITO), or indium zinc oxide (IZO), but are not limited thereto.

In FIG. 1, the first conductive layer 21 and the second conductive layer 22 are disconnected from each other. However, this is merely an example, and the first conductive layer 21 and the second conductive layer 22 may be coupled (or connected) to each other.

The insulating layer 30 may be disposed on the first conductive layer 21 and the second conductive layer 22. The insulating layer 30 may include apertures respectively corresponding to the region of the first contact hole H1 and the region of the second contact hole H2. The insulating layer 30 may be made of an insulating material. For example, the insulating layer 30 may be made of silicon nitride, silicon oxide, or a compound of silicon nitride and/or silicon oxide, but is not limited thereto.

The third conductive layer 23 may be disposed on the insulating layer 30. The third conductive layer 23 may extend into the aperture of the insulating layer 30 which corresponds to the first contact hole H1 and may contact the first conductive layer 21 in the first contact hole H1 to be coupled (or connected) to the first conductive layer 21.

The fourth conductive layer 24 may be disposed on the insulating layer 30. The fourth conductive layer 24 may extend into the aperture of the insulating layer 30 which corresponds to the second contact hole H2 and may contact the second conductive layer 22 in the second contact hole H2 to be coupled (or connected) to the second conductive layer 22.

The third conductive layer 23 and the fourth conductive layer 24 may be made of a conductive material. For example, the third conductive layer 23 and the fourth conductive layer 24 may be made of metal such as copper, iron, silver, gold or platinum, ITO, or IZO, but are not limited thereto.

In FIG. 1, the third conductive layer 23 and the fourth conductive layer 24 are disconnected from each other. However, this is merely an example, and the third conductive layer 23 and the fourth conductive layer 24 may be coupled (or connected) to each other.

According to an embodiment, the first contact hole H1 couples (or connects) the first conductive layer 21 and the third conductive layer 23, and includes the aperture of the insulating layer 30 which corresponds to the first contact hole H1, the third conductive layer 23 which is disposed inside the aperture, and the first conductive layer 21 whose top surface is exposed by the aperture.

The second contact hole H2 couples (or connects) the second conductive layer 22 and the fourth conductive layer 24, and includes the aperture of the insulating layer 30 which corresponds to the second contact hole H2, the fourth conductive layer 24 which is disposed inside the aperture, and the second conductive layer 22 whose top surface is exposed by the aperture.

Figure 2:
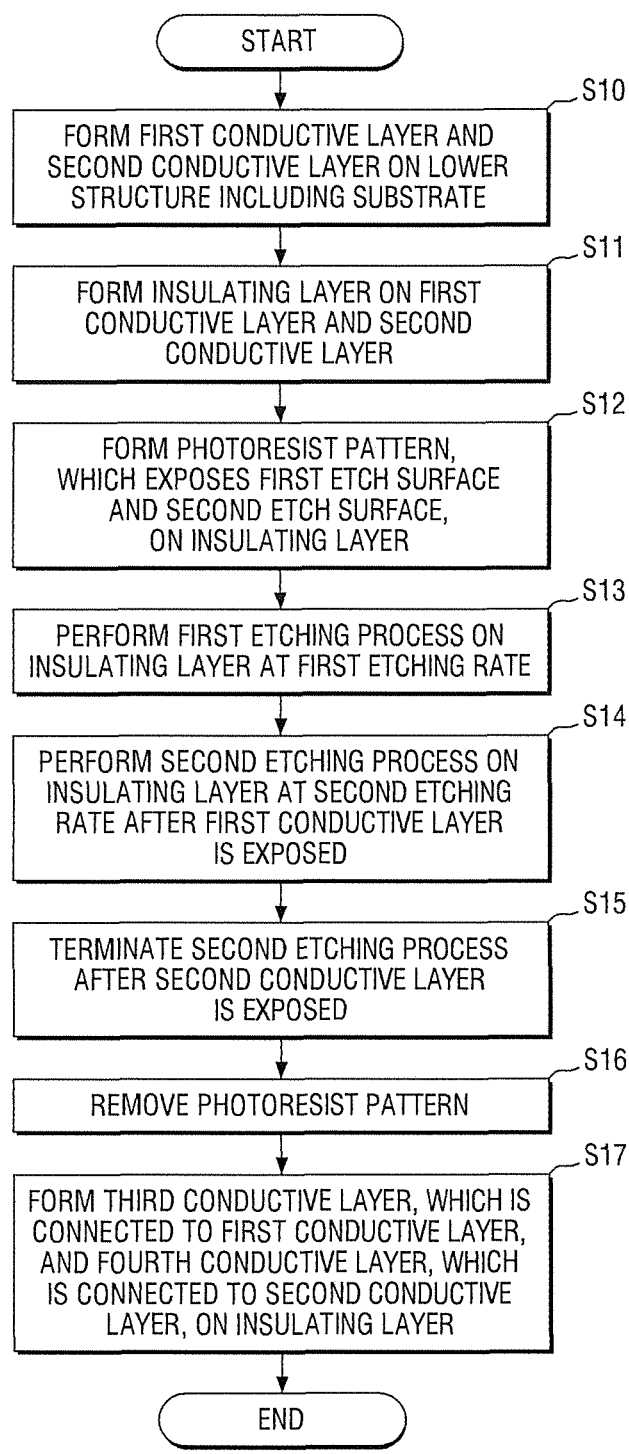
FIG. 2 is a flowchart illustrating a method of forming contact holes according to an embodiment of the present invention.

A method of forming contact holes according to an embodiment of the present invention will now be described with reference to FIGS. 2 through 8. FIG. 2 is a flowchart illustrating a method of forming contact holes according to an embodiment of the present invention. FIGS. 3 through 8 are cross-sectional views of a structure illustrating a method of forming first and second contact holes H1 and H2 according to an embodiment of the present invention.

Figure 3:
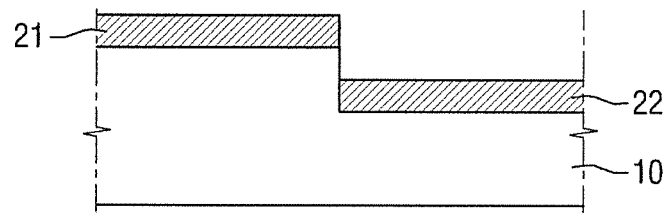
FIGS. 3 through 8 are cross-sectional views of a structure illustrating a method of forming first and second contact holes according to an embodiment of the present invention.

Referring to FIGS. 2 and 3, a method of forming contact holes may include forming a first conductive layer 21 and a second conductive layer 22 on a lower structure 10 including a substrate (operation S10). A top surface of the lower structure 10 may be formed as a step (or stepped). The stepped top surface of the lower structure 10 may cause the first conductive layer 21 and the second conductive layer 22 to be formed at different heights. The first conductive layer 21 may be disposed on a relatively more protruding region of the top surface of the lower structure 10, and the second conductive layer 22 may be disposed on a less protruding region of the top surface of the lower structure 10. Even if not all regions of the first conductive layer 21 are located at a higher position than the second conductive layer 22, at least a region of the first conductive layer 21 included in the first contact hole H1 may be located at a higher position than a region of the second conductive layer 22 included in the second contact hole H2.

The first conductive layer 21 and the second conductive layer 22 may be formed by a single process or separate processes. The first conductive layer 21 and the second conductive layer 22 may be formed by processes such as deposition or etching, but are not limited thereto.

Figure 4:
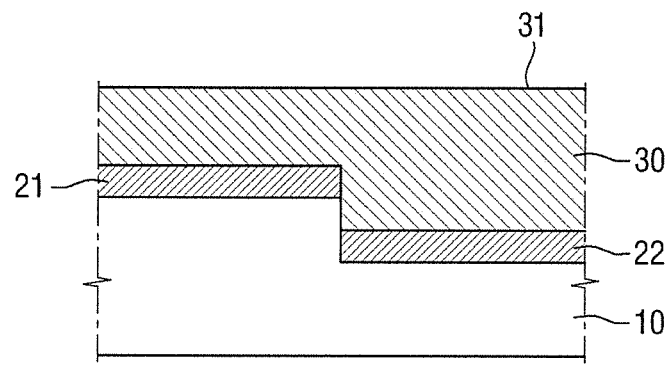

Referring to FIGS. 2 and 4, the method of forming contact holes may further include forming an insulating layer 30 on the first conductive layer 21 and the second conductive layer 22 (operation S11). A top surface 31 of the insulating layer 30 may be substantially flat.

Figure 5:
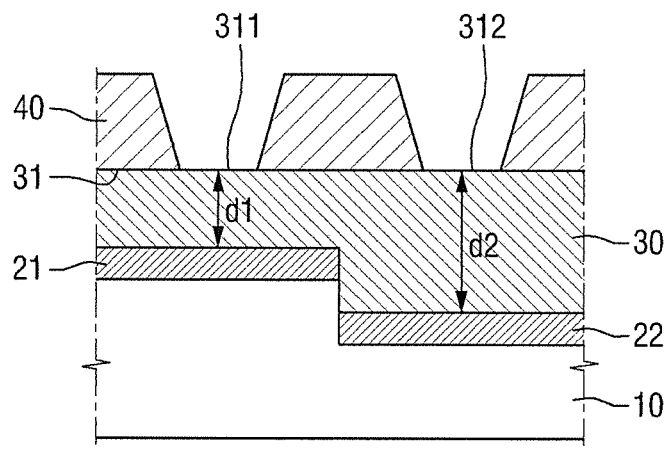

Referring to FIGS. 2 and 5, the method of forming contact holes may further include forming a photoresist pattern 40, which exposes a first etch surface 311 and a second etch surface 312, on the insulating layer 30 (operation S12). The top surface 31 of the insulating layer 30 may include the first etch surface 311 and the second etch surface 312. The first etch surface 311 and the second etch surface 312 may not be covered by the photoresist pattern 40.

A distance d1 between the first etch surface 311 and the first conductive layer 21 may be smaller than a distance d2 between the second etch surface 312 and the second conductive layer 22. Accordingly, the second contact hole H2 may be deeper than the first contact hole H1.

Figure 6:
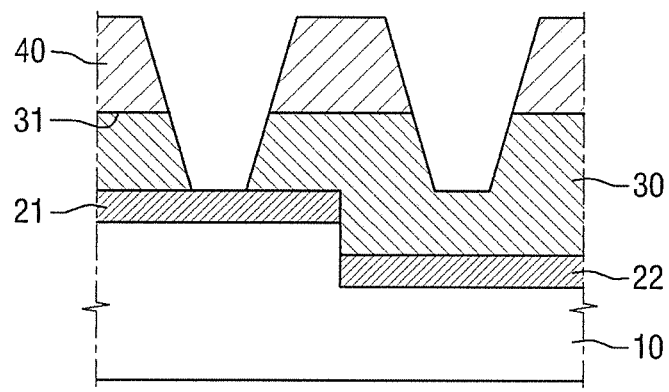

Referring to FIGS. 2 and 6, the method of forming contact holes may further include performing a first etching process on the insulating layer 30 at a first etching rate (operation S13). An etching rate refers to an amount by which the insulating layer 30 is etched per unit of time. In the first etching process, the insulating layer 30 may be etched from the first etch surface 311 and the second etch surface 312. The first etching process may be performed until a period of time (e.g., a predetermined period of time) elapses after a top surface of the first conductive layer 21 is exposed through the insulating layer 30.

The first etching process may be performed in an etching chamber. The first etching process may be performed using an etching gas which etches the insulating layer 30. The etching gas may be $SF_6$, $C_4F_8$, $Cl_2$, $CF_4$, or $NF_3$, but is not limited thereto. The etching gas may be mixed with a mixed gas and introduced into the etching chamber. The mixed gas may be $O_2$, Ar, or $N_2$, but is not limited thereto. Power may be supplied to the etching chamber in order to form an electric field in the etching chamber, and the etching rate may be controlled by the magnitude of the power.

Figure 7:
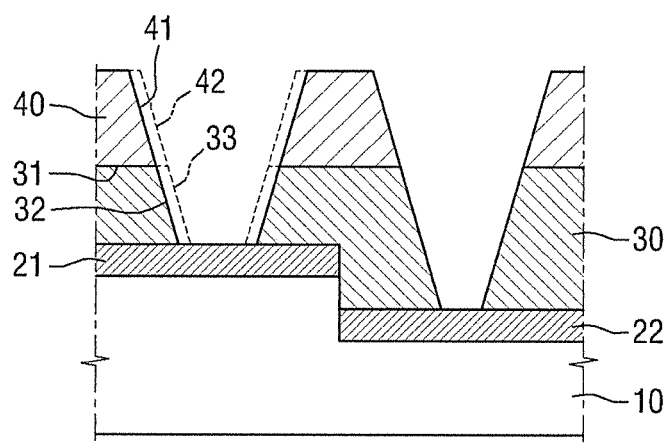

Referring to FIGS. 2 and 7, the method of forming contact holes may further include performing a second etching process on the insulating layer 30 at a second etching rate after the first conductive layer 21 is exposed (operation S14) and terminating the second etching process after the second conductive layer 22 is exposed (operation S15).

The second etching process may be performed from when the first etching process is terminated after the period of time (e.g., the predetermined period of time) has elapsed after the top surface of the first conductive layer 21 was exposed through the insulating layer 30. The second etching process may be performed until a period of time (e.g., a predetermined period of time) elapses after a top surface of the second conductive layer 22 is exposed through the insulating layer 30. The second etching process may be performed until a top surface of a region of the second conductive layer 22 needed for stable coupling (or connection) of the second conductive layer 22 and a fourth conductive layer 24 is exposed through the insulating layer 30.

The second etching process may be performed at the second etching rate which is higher than the first etching rate. To perform the second etching process at a higher etching rate than the first etching process, the concentration of the etching gas in the etching chamber may be increased, or the power supplied to the etching chamber may be increased.

During the second etching process, sidewalls of an aperture of the insulating layer 30 which exposes the top surface of the first conductive layer 21 may retreat from first sidewalls 33 to second sidewalls 32. Likewise, sidewalls of an aperture of the photoresist pattern 40 which exposes the top surface of the second conductive layer 22 may retreat from third sidewalls 42 to fourth sidewalls 41. During the second etching process, an exposed region of the first conductive layer 21 may also be etched. Thus, a portion of the first conductive layer 21 may come away from the first conductive layer 21. A material coming away from the first conductive layer 21 may accumulate on the first sidewalls 33 or the third sidewalls 42 or may react with the etching gas to form polymer which, in turn, accumulates on the first sidewalls 33 or the third sidewalls 42. The material or polymer accumulated on the first sidewalls 33 or the third sidewalls 42 may hinder the etching of the first sidewalls 33. Therefore, after the completion of the second etching process, residues of the insulating layer 30 may remain on the first conductive layer 21, whose top surface is exposed through the aperture of the insulating layer 30, to be separated from the second sidewalls 32. The residues of the insulating layer 30 may reduce the contact between the first conductive layer 21 and a third conductive layer 23, thereby increasing the resistance of the first contact hole H1. In addition, the residues of the insulating layer 30 may reduce the adhesion of the first conductive layer 21 to the third conductive layer 23 in the first contact hole H1. This may increase the probability that cracks will be formed between the first conductive layer 21 and the third conductive layer 23 by external impact.

However, the method of forming contact holes according to the current embodiment includes performing the second etching process at the second etching rate which is higher than the first etching rate. Therefore, the duration of the second etching process is reduced, which, in turn, reduces the amount of residues of the insulating layer 30 existing on the first conductive layer 21 whose top surface is exposed through the aperture of the insulating layer 30. The reduced amount of residues may reduce the resistance of the first contact hole H1 and the probability that cracks will be formed between the first conductive layer 21 and the third conductive layer 23.

Figure 8:
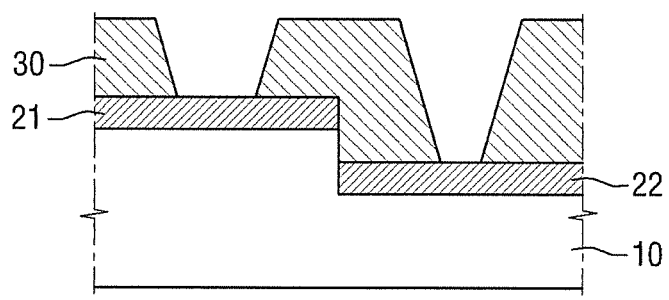

Referring to FIGS. 2 and 8, the method of forming contact holes may further include removing the photoresist pattern 40 (operation S16).

The method of forming contact holes may further include forming the third conductive layer 23, which is coupled (or connected) to the first conductive layer 21, and the fourth conductive layer 24, which is coupled (or connected) to the second conductive layer 22, on the insulating layer 30 (operation S17).

The third conductive layer 23 may extend from the top surface 31 of the insulating layer 30 into the aperture of the insulating layer 30, which exposes the top surface of the first conductive layer 21, to contact the first conductive layer 21.

The fourth conductive layer 24 may extend from the top surface 31 of the insulating layer 30 into the aperture of the insulating layer 30, which exposes the top surface of the second conductive layer 22, to contact the second conductive layer 22.

The formation of the third conductive layer 23 coupled (or connected) to the first conductive layer 21 and the fourth conductive layer 24 coupled (or connected) to the second conductive layer 22 on the insulating layer 30 may complete the structure of FIG. 1.

Figure 9:
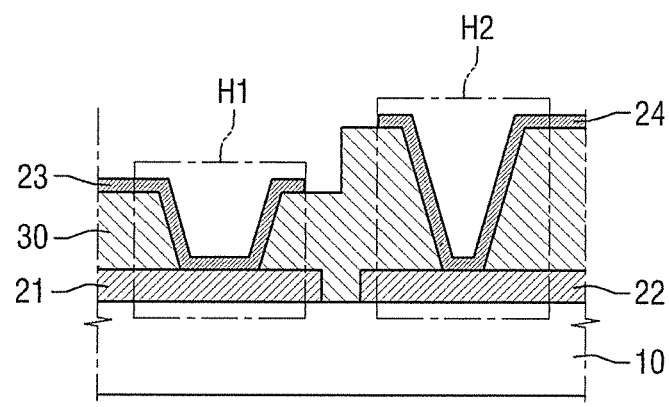
FIG. 9 is a cross-sectional view of a structure including first and second contact holes according to another embodiment of the present invention.

Another embodiment of the present invention will now be described with reference to FIG. 9. FIG. 9 is a cross-sectional view of a structure including first and second contact holes H1 and H2 according to another embodiment of the present invention.

Referring to FIG. 9, a first conductive layer 21 and a second conductive layer 22 may be formed at substantially the same (or the same) height. Even if not all regions of the first conductive layer 21 and not all regions of the second conductive layer 22 are formed at substantially the same (or the same) height, at least a region of the first conductive layer 21 which contacts a third conductive layer 23 in the first contact hole H1 and at least a region of the second conductive layer 22 which contacts a fourth conductive layer 24 in the second contact hole H2 may be at substantially the same (or the same) height.

A top surface of an insulating layer 30 may be formed as a step (or stepped). The stepped top surface of the insulating layer 30 may cause a region of the top surface of the insulating layer 30 adjacent to the second contact hole H2 to be higher than a region of the top surface of the insulating layer 30 adjacent to the first contact hole H1.

If the second contact hole H2 is deeper than the first contact hole H1, even when the first conductive layer 21 and the second conductive layer 22 are formed at substantially the same (or the same) height as shown in FIG. 9, the first contact hole H1 and the second contact hole H2 may be formed in substantially the same (or the same) way as the contact hole formation method of FIG. 2.

According to some embodiments, the first conductive layer 21 and the second conductive layer 22 may be formed at different heights, and the region of the top surface of the insulating layer 30 adjacent to the first contact hole H1 and the region of the top surface of the insulating layer 30 adjacent to the second contact hole H2 may be at different heights. Even in this case, if the second contact hole H2 is deeper than the first contact hole H1, the first contact hole H1 and the second contact hole H2 may be formed in substantially the same (or the same) way as the contact hole formation method of FIG. 2.

Figure 10:
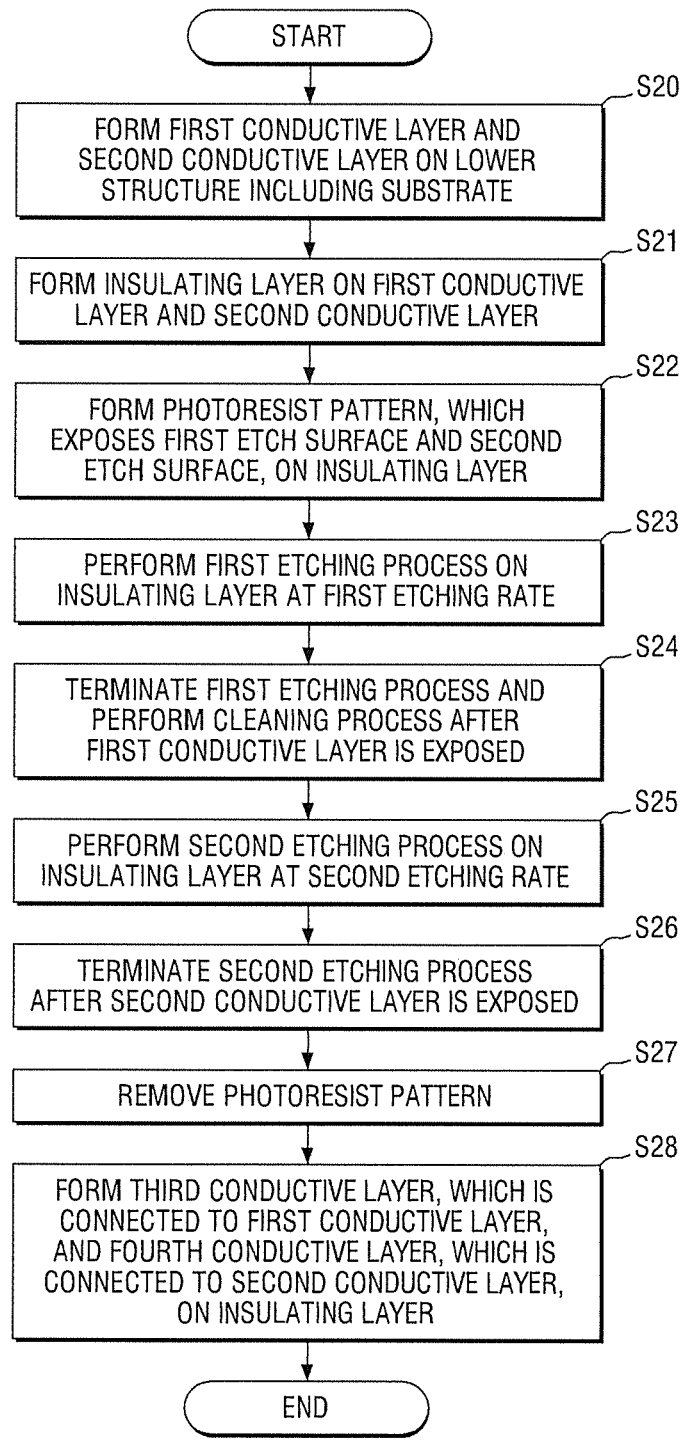
FIG. 10 is a flowchart illustrating a method of forming contact holes according to another embodiment of the present invention.

Another embodiment of the present invention will now be described with reference to FIG. 10. FIG. 10 is a flowchart illustrating a method of forming contact holes according to another embodiment of the present invention. A structure created by the contact hole formation method of FIG. 10 may be substantially identical to the structure of FIG. 1 or 9.

Referring to FIG. 10, the method of forming contact holes may include forming a first conductive layer 21 and a second conductive layer 22 on a lower structure 10 including a substrate (operation S20), forming an insulating layer 30 on the first conductive layer 21 and the second conductive layer 22 (operation S21), forming a photoresist pattern 40, which exposes a first etch surface 311 and a second etch surface 312, on the insulating layer 30 (operation S22), performing a first etching process on the insulating layer 30 at a first etching rate (operation S23), terminating the first etching process and performing a cleaning process after the first conductive layer 21 is exposed (operation S24), performing a second etching process on the insulating layer 30 at a second etching rate (operation S25), terminating the second etching process after the second conductive layer 22 is exposed (operation S26), removing the photoresist pattern 40 (operation S27), and forming a third conductive layer 23, which is coupled (or connected) to the first conductive layer 21, and a fourth conductive layer 24, which is coupled (or connected) to the second conductive layer 22, on the insulating layer 30 (operation S28).

Operations S20, S21, S22, S23, S26, S27 and S28 of FIG. 10 may be substantially identical to operations S10, S11, S12, S13, S15, S16 and S17 of FIG. 2, respectively.

The terminating of the first etching process and the performing of the cleaning process after the first conductive layer 21 is exposed (operation S24) may be performed after a period of time (e.g., a predetermined period of time) elapses from a time when a top surface of the first conductive layer 21 begins to be exposed through the insulating layer 30. For a period of time from the time when the top surface of the first conductive layer 21 begins to be exposed through the insulating layer 30 to a time when the first etching process is terminated, a region of the first conductive layer 21 exposed through the insulating layer 30 may be etched. Thus, a portion of the first conductive layer 21 may come away from the first conductive layer 21. A material coming away from the first conductive layer 21 may accumulate on sidewalls of an aperture of the insulating layer 30 which exposes the first conductive layer 21 or may react with an etching gas to form polymer which, in turn, accumulates on the sidewalls. The material or polymer accumulated on the sidewalls may hinder the etching of the sidewalls. Therefore, residues of the insulating layer 30 may remain on the first conductive layer 21 whose top surface is exposed through the aperture of the insulating layer 30. The residues of the insulating layer 30 may reduce the contact between the first conductive layer 21 and a third conductive layer 23, thereby increasing the resistance of the first contact hole H1. In addition, the residues of the insulating layer 30 may reduce the adhesion of the first conductive layer 21 to the third conductive layer 23 in the first contact hole H1. This may increase the probability that cracks will be formed between the first conductive layer 21 and the third conductive layer 23 by external impact.

However, if the cleaning process is performed after the first etching process is terminated, the residues of the insulating layer 30 (which are created during the period of time from the time when the top surface of the first conductive layer 21 begins to be exposed through the insulating layer 30 to the time when the first etching process is terminated), the material coming away from the first conductive layer 21, and the polymer accumulated on the sidewalls during the above period of time may be removed. Therefore, the method of forming contact holes according to the current embodiment may reduce the resistance of the first contact hole H1 and the probability that cracks will be formed between the first conductive layer 21 and the third conductive layer 23.

The performing of the second etching process on the insulating layer 30 at the second etching rate (operation S25) may be performed after the terminating of the first etching process and the performing of the cleaning process after the first conductive layer 21 is exposed (operation S24). Other aspects of the performing of the second etching process on the insulating layer 30 at the second etching rate (operation S25) may be identical to those of operation S14 of FIG. 2.

Embodiments of the present invention may address at least one of the following issues.

When contact holes are formed, residues of an insulating layer disposed on a lower wiring layer may be reduced.

The resistance of a contact hole may be reduced.

Furthermore, the formation of cracks in wiring layers within the contact hole may be reduced (or prevented).

However, the effects of the present invention are not restricted to the ones set forth herein. The above and other effects of the present invention will become more apparent to one of ordinary skill in the art to which the present invention pertains by referencing the claims and their equivalents.

What is claimed is:

1. A method of forming contact holes, the method comprising:
    forming a first conductive layer and a second conductive layer on a lower structure comprising a substrate;
    forming an insulating layer on the first conductive layer and the second conductive layer;
    forming a photoresist pattern which exposes first and second etch surfaces of a top surface of the insulating layer;
    performing a first etching process on the insulating layer at a first etching rate; and
    performing a second etching process on the insulating layer at a second etching rate which is higher than the first etching rate, after a top surface of the first conductive layer is exposed through the insulating layer,
    wherein the first etch surface is on the first conductive layer, the second etch surface is on the second conductive layer, and a distance between the second etch surface and the second conductive layer is greater than a distance between the first etch surface and the first conductive layer.

2. The method of claim 1, further comprising terminating the second etching process after a top surface of the second conductive layer is exposed through the insulating layer.

3. The method of claim 2, further comprising removing the photoresist pattern after the terminating of the second etching process.

4. The method of claim 3, further comprising forming a third conductive layer, which is coupled to the first conductive layer, and a fourth conductive layer, which is coupled to the second conductive layer, on the insulating layer after the removing of the photoresist pattern.

5. The method of claim 1, wherein the first etching process and the second etching process are performed in an etching chamber, and a concentration of an etching gas in the etching chamber is higher in the second etching process than in the first etching process.

6. The method of claim 1, wherein the first etching process and the second etching process are performed in an etching chamber, and bias power applied to the etching chamber is higher in the second etching process than in the first etching process.

7. The method of claim 1, wherein the first conductive layer and the second conductive layer are coupled to each other.

8. The method of claim 1, wherein the first etch surface is at substantially the same height as the second etch surface.

9. The method of claim 1, wherein the first conductive layer is at substantially the same height as the second conductive layer.

10. The method of claim 1, wherein the second conductive layer is formed at a higher position than the first conductive layer.

11. A method of forming contact holes, the method comprising:
    forming a first conductive layer and a second conductive layer on a lower structure comprising a substrate;
    forming an insulating layer, whose top surface comprises a first etch surface and a second etch surface, on the first conductive layer and the second conductive layer;
    forming a photoresist pattern which exposes the first and second etch surfaces;
    performing a first etching process on the insulating layer at a first etching rate;

cleaning the first conductive layer under the first etch surface after a top surface of the first conductive layer under the first etch surface is exposed through the insulating layer; and performing a second etching process on the insulating layer at a second etching rate which is higher than the first etching rate after the cleaning of the first conductive layer, wherein a distance between the second etch surface and the second conductive layer is greater than a distance between the first etch surface and the first conductive layer.

12. The method of claim 11, further comprising terminating the second etching process after a top surface of the second conductive layer is exposed through the insulating layer.

13. The method of claim 12, further comprising removing the photoresist pattern after the terminating of the second etching process.

14. The method of claim 13, further comprising forming a third conductive layer, which is coupled to the first conductive layer, and a fourth conductive layer, which is coupled to the second conductive layer, on the insulating layer after the removing of the photoresist pattern.

15. The method of claim 14, wherein the first etching process and the second etching process are performed in an etching chamber, and a concentration of an etching gas in the etching chamber is higher in the second etching process than in the first etching process.

16. The method of claim 14, wherein the first etching process and the second etching process are performed in an etching chamber, and bias power applied to the etching chamber is higher in the second etching process than in the first etching process.

17. The method of claim 11, wherein the first conductive layer and the Second conductive layer are coupled to each other.

18. The method of claim 11, wherein the first etch surface is at substantially the same height as the second etch surface.

19. The method of claim 11, wherein the first conductive layer is at substantially the same height as the second conductive layer.

20. The method of claim 11, wherein the second conductive layer is formed at a higher position than the first conductive layer.

* * * * *